(12) United States Patent
Noguchi et al.

(10) Patent No.: US 9,692,203 B2
(45) Date of Patent: Jun. 27, 2017

(54) OPTICAL MODULE

(71) Applicant: Oclaro Japan, Inc., Kanagawa (JP)

(72) Inventors: Daisuke Noguchi, Kanagawa (JP); Kazuhiro Komatsu, Tokyo (JP)

(73) Assignee: OCLARO JAPAN, INC., Kanagawa (JP)

( * ) Notice: Subject to any disclaimer, the term of this patent is extended or adjusted under 35 U.S.C. 154(b) by 0 days.

(21) Appl. No.: 15/171,189

(22) Filed: Jun. 2, 2016

(65) Prior Publication Data

US 2016/0365700 A1  Dec. 15, 2016

(30) Foreign Application Priority Data

Jun. 12, 2015  (JP) .................................. 2015-118924

(51) Int. Cl.
- *H01S 5/022* (2006.01)
- *H01S 5/062* (2006.01)
- *H01S 5/024* (2006.01)

(52) U.S. Cl.
CPC ...... *H01S 5/02212* (2013.01); *H01S 5/02276* (2013.01); *H01S 5/06226* (2013.01); *H01S 5/02288* (2013.01); *H01S 5/02469* (2013.01)

(58) Field of Classification Search
CPC ............. H01S 5/02212; H01S 5/02276; H01S 5/06226; H01S 5/02288
See application file for complete search history.

(56) References Cited

U.S. PATENT DOCUMENTS

| 2004/0208211 A1* | 10/2004 | Maruyama | H01S 5/02212 372/38.1 |
| 2010/0006863 A1 | 1/2010 | Ban et al. | |
| 2016/0006210 A1* | 1/2016 | Noguchi | H01L 31/0203 438/26 |

FOREIGN PATENT DOCUMENTS

JP  2009-302438 A  12/2009

* cited by examiner

*Primary Examiner* — Dung Nguyen
(74) *Attorney, Agent, or Firm* — Mattingly & Malur, PC

(57) ABSTRACT

An optical module includes: a wiring substrate that has a wiring pattern including a connecting portion and is arranged on an optical subassembly so as to be electrically connected thereto; and a flexible insulating layer formed between the optical subassembly and the wiring substrate. The optical subassembly includes: a conductive stem that has a surface opposed to the wiring substrate, the conductive stem being shaped so that the surface has a through hole opened therein and being connected to a reference potential; and a signal lead for transmitting a signal, the signal lead passing through the through hole while being electrically insulated from the conductive stem. The signal lead passes through the flexible insulating layer to be joined to the connecting portion. The flexible insulating layer is in contact with the connecting portion, the signal lead, and the surface of the conductive stem.

14 Claims, 9 Drawing Sheets

OPTICAL MODULE

CROSS-REFERENCE TO RELATED APPLICATION

The present application claims priority from Japanese application JP2015-118924 filed on Jun. 12, 2015, the content of which is hereby incorporated by reference into this application.

BACKGROUND OF THE INVENTION

1. Field of the Invention

The present invention relates to an optical module.

2. Description of the Related Art

A CAN-type optical module used in optical communication generally includes an electrically-grounded stem and a lead terminal that passes through the stem and is insulated from the stem. The stem and a cap mounted to the stem form a housing for accommodating an optical semiconductor device. The lead terminal and the stem form a coaxial line. One end portion of the lead terminal is connected to the optical semiconductor device. Another end portion of the lead terminal is connected to a drive device configured to output a modulated electrical signal, via a wiring substrate, e.g., an FPC having a signal line and a ground formed along the signal line.

Increases in communication speed are leading to an increase in the frequency of the modulated electrical signal output from the drive device. Due to the increase in the frequency of the electrical signal, reflection of the electrical signal tends to occur in a transmission line at locations at which there are mismatches in the characteristic impedance. Characteristic impedance mismatches tend to occur between, for example, the coaxial line, which is formed by the lead terminal and the stem, and the wiring substrate, e.g., an FPC. At locations in the transmission line at which there are mismatches in the characteristic impedance, reflection waves of the electrical signals are generated to interfere with original modulated electrical signals, resulting in lowered waveform quality of optical signals. In order to suppress to a minimum the effects of characteristic impedance mismatches on the optical waveform at a connecting portion between the lead terminal and the FPC at which characteristic impedance mismatches tend to occur, in Japanese Patent Application Laid-open No. 2009-302438, there are proposed structures for suppressing characteristic impedance mismatches.

Specifically, in Japanese Patent Application Laid-open No. 2009-302438, a flexible printed board, which is vertically mounted on a CAN-type package in the related art, is horizontally connected to the CAN-type package, thereby suppressing impedance mismatches.

In recent years, optical modules have been strongly demanded to achieve not only a lowered cost but also an increased speed. If high-speed optical signals in the 25 Gbit/s class can be transmitted with inexpensive CAN-type optical modules, both the demands for a lowered cost and an increased communication speed can be satisfied. However, if a unique flexible printed board connection method, e.g., the one proposed in Japanese Patent Application Laid-open No. 2009-302438, is employed for suppressing impedance mismatches, soldering is complicated, thereby influencing processing costs and yields of optical modules. As a result, the optical modules may not be stably manufactured and supplied.

SUMMARY OF THE INVENTION

It is an object of the present invention to provide a mode of an inexpensive optical module that is capable of transmitting or receiving high-speed optical signals, is excellent in high-frequency characteristics, and does not increase a cost.

(1) An optical module according to one embodiment of the present invention includes: an optical subassembly configured to convert at least one of an optical signal or an electrical signal into another one of the optical signal and the electrical signal; a wiring substrate that has a wiring pattern including a connecting portion and is arranged on the optical subassembly so as to be electrically connected thereto; and a flexible insulating layer formed between the optical subassembly and the wiring substrate, the optical subassembly including: a conductive stem that has a surface opposed to the wiring substrate, the conductive stem being shaped so that the surface has a through hole opened therein and being connected to a reference potential; and a signal lead for transmitting a signal, the signal lead passing through the through hole while being electrically insulated from the conductive stem, the signal lead passing through the flexible insulating layer to be joined to the connecting portion, the flexible insulating layer being in contact with the connecting portion, the signal lead, and the surface of the conductive stem. According to the present invention, a space between the connecting portion and the signal lead, a space between the connecting portion and the surface of the stem, and a space between the signal lead and the surface of the stem are filled with the flexible insulating layer, and hence neither a space with only air nor a vacuumed space is formed therein. Thus, parasitic inductance of the signal lead can be reduced.

(2) In the optical module according to Item (1), the wiring substrate may include an insulating substrate having a thickness corresponding to a distance between a first surface and a second surface of the insulating substrate, the first surface maybe opposed to the surface of the conductive stem, and at least part of the connecting portion may be formed on the first surface.

(3) In the optical module according to Item (2), the connecting portion may be formed on the first surface and the second surface so as to pass through the insulating substrate, to thereby form a through-hole via for electrical connection, and the signal lead may be inserted into the through-hole via.

(4) In the optical module according to Item (2) or (3), the wiring pattern may include signal wiring connected to the connecting portion, for transmitting the signal, and a plane layer for connection with the reference potential.

(5) In the optical module according to Item (4), the signal wiring may be formed on the second surface, and the plane layer may be formed on the first surface.

(6) In the optical module according to Item (4), the signal wiring may be formed on the first surface, and the plane layer may be formed on the second surface.

(7) In the optical module according to any one of Items (2) to (6), the wiring substrate may include a protective film for covering the wiring pattern, and the wiring pattern may be formed on the first surface and the second surface.

(8) In the optical module according to Item (7), the wiring pattern formed on the first surface may overlap the conductive stem.

(9) In the optical module according to Item (7), the wiring pattern formed on the first surface may overlap a region other than the conductive stem.

(10) In the optical module according to any one of Items (7) to (9), the protective film formed on the first surface may overlap the conductive stem. (11) In the optical module according to any one of Items (7) to (9), the protective film formed on the first surface may overlap a region other than the conductive stem.

(12) In the optical module according to any one of Items (1) to (11), the optical subassembly may further include a reference lead electrically connected to the conductive stem in order to electrically connect the conductive stem to the reference potential.

(13) In the optical module according to any one of Items (1) to (11), the wiring pattern may be electrically connected to the conductive stem on the first surface, and the conductive stem may be electrically connected to the wiring pattern on a side surface of the conductive stem while avoiding the surface.

(14) In the optical module according to any one of Items (1) to (13), the through hole of the conductive stem and the signal lead may be electrically insulated from each other with an insulating material, the insulating material may be filled so that a projecting portion is formed that protrudes from the surface of the conductive stem, and the flexible insulating layer may have a recessed portion in contact with the projecting portion.

DETAILED DESCRIPTION OF THE INVENTION

Figure 1:
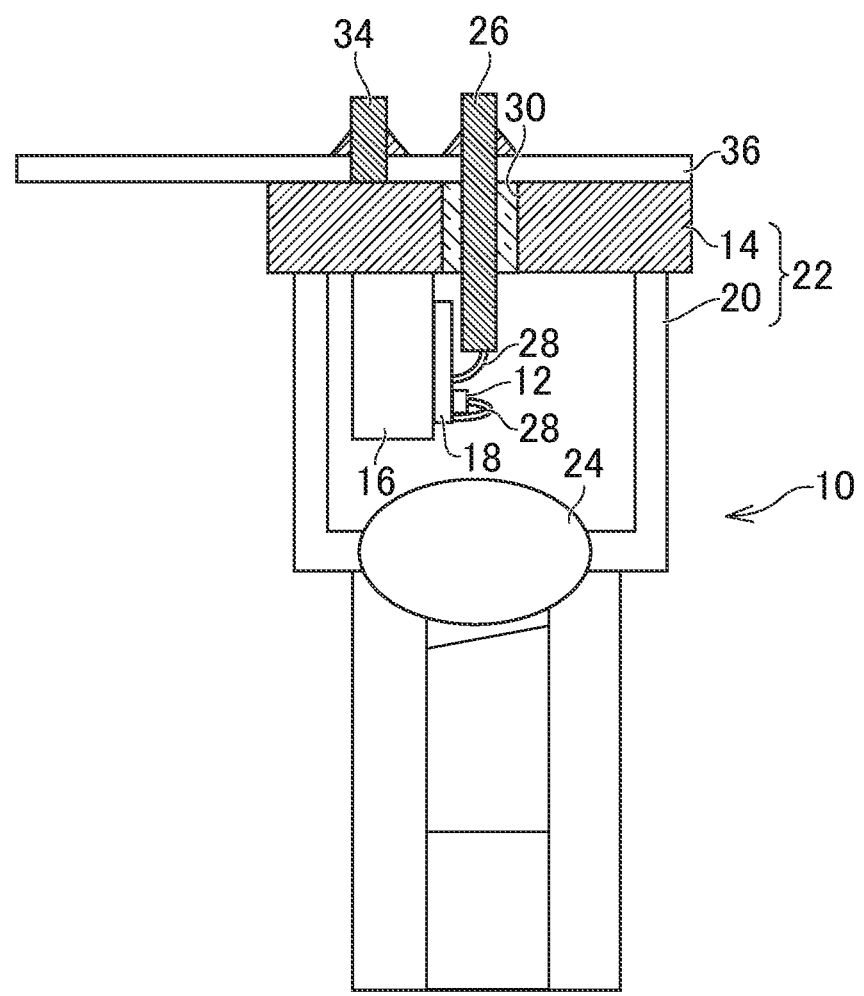
FIG. 1 is a sectional view for schematically illustrating an optical module according to a first embodiment of the present invention.

Referring to the accompanying drawings, embodiments of the present invention are described below. In the drawings, the same or similar components are denoted by the same reference symbols, and repetitive description thereof is omitted.

First Embodiment

FIG. 1 is a sectional view for schematically illustrating an optical module according to a first embodiment of the present invention. The optical module includes an optical subassembly 10 configured to convert at least one of an optical signal or an electrical signal into the other. Examples of the optical subassembly 10 include an optical transmitter module (transmitter optical subassembly; TOSA) that includes a light emitting element, e.g., a semiconductor laser 12, and is configured to convert an electrical signal into an optical signal and transmit the optical signal, an optical receiver module (receiver optical subassembly; ROSA) that includes a light receiving element represented by a photodiode and is configured to convert a received optical signal into an electrical signal, and a bidirectional optical subassembly (BOSA) having both the functions of those optical subassemblies.

The invention of the subject application can be applied to any of the above-mentioned optical subassemblies, and an optical transmitter module is described below as an example.

The optical subassembly 10 includes a conductive stem 14 formed, for example, of metal. The stem 14 is connected to a reference potential (for example, a ground). A seat 16 is fixed to the stem 14. A heat dissipation substrate 18 is mounted on the seat 16 with the use of a solder material, a conductive adhesive, or others. The heat dissipation substrate 18 has high heat conductivity, and is formed of an insulating material having a thermal expansion coefficient close to that of the semiconductor laser 12 (for example, aluminum nitride). A metal film (not shown) is formed on a surface of the heat dissipation substrate 18. The semiconductor laser 12 is supported by the seat 16 via the heat dissipation substrate 18.

A cap 20 is joined to the stem 14 so as to cover the semiconductor laser 12. The stem 14 and the cap 20 form a housing 22 for accommodating the semiconductor laser 12. The housing 22 is airtight. The cap 20 has an opening formed therein, and a lens 24 configured to collect light from the semiconductor laser 12 is arranged in this opening.

The optical subassembly 10 includes a signal lead 26 for transmitting signals. The signal lead 26 is a terminal for transmitting modulated electrical signals to the semiconductor laser 12. One end portion of the signal lead 26 is protruded from the stem 14 into the housing 22. This protruded portion is connected, via a wire 28, solder, or others, to the metal film (not shown) formed on the surface of the heat dissipation substrate 18. The semiconductor laser 12 and the metal film (not shown) formed on the surface of the heat dissipation substrate 18 are also connected to each other via the wire 28. Electronic components other than the semiconductor laser 12 (that are not shown) may also be provided, e.g., a lead for supplying power that is connected to a photodiode configured to monitor an output of the semiconductor laser 12 or other components.

Figure 2:
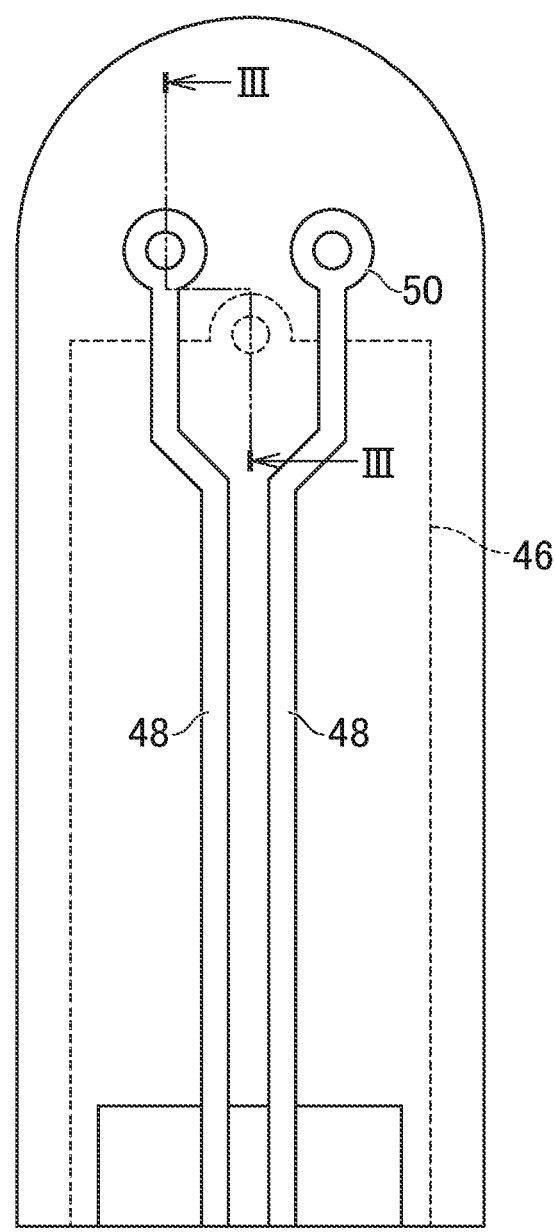
FIG. 2 is a top view of the optical module according to the first embodiment of the present invention when viewed from a wiring substrate side.
Figure 3:
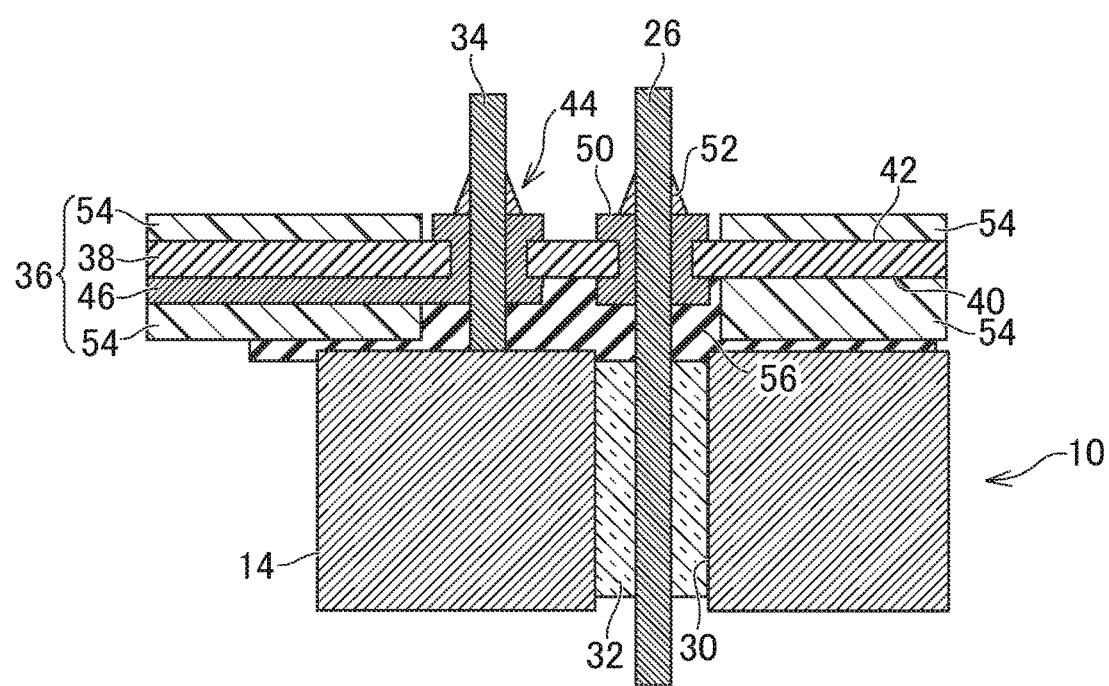
FIG. 3 is a sectional view of the optical module illustrated in FIG. 1 taken along the line of FIG. 2.

FIG. 2 is a top view of the optical module according to the first embodiment of the present invention when viewed from the wiring substrate side. A plane layer 46, which is described later, cannot be actually seen because the plane layer 46 is formed on the rear side (stem 14 side) of an insulating substrate 38, which is described later. However, the plane layer 46 is illustrated in FIG. 2 for convenience of understanding. FIG. 3 is a sectional view for illustrating the details of the optical module according to the first embodiment of the present invention taken along the line III-III of FIG. 2. The stem 14 has a through hole 30 passing there-through in a thickness direction of the stem 14. The signal lead 26 passes through the through hole 30 of the stem 14, and is electrically insulated from the stem 14. For this, the through hole 30 is filled with an insulating material 32, e.g., a glass material, and the signal lead 26 is held inside the through hole 30 with the insulating material 32.

The optical subassembly 10 includes a reference lead 34. The reference lead 34 is electrically connected to the stem 14 in order to electrically connect the stem 14 to a reference potential (for example, a ground). The reference lead 34 is brazed with the stem 14.

The optical module includes a wiring substrate 36 (for example, a flexible printed board). The wiring substrate 36 is arranged on the optical subassembly 10 (specifically, the stem 14) and is electrically connected thereto. The wiring substrate 36 includes the insulating substrate 38. The insulating substrate 38 has a first surface 40 and a second surface 42, and a distance between the surfaces corresponds to a thickness of the insulating substrate 38. The wiring substrate 36 (first surface 40) is opposed to a surface of the stem 14 (a surface in which the through hole 30 is opened).

The wiring substrate 36 has a wiring pattern 44. The wiring pattern 44 is formed on the first surface 40 and the second surface 42. The wiring pattern 44 formed on the first surface 40 overlaps the stem 14. The wiring pattern 44 includes the plane layer 46. The plane layer 46 is formed on the first surface 40. The plane layer 46 is connected to the reference potential with the reference lead 34 that passes through part of the plane layer 46 (a connecting portion or a pad) and is soldered thereto.

The wiring pattern 44 includes signal wiring 48. The signal wiring 48 is formed on the second surface 42. The signal wiring 48 for transmitting signals is connected to a connecting portion (or a pad) 50. The wiring pattern 44 includes the connecting portion 50. At least part of the connecting portion 50 is formed on the first surface 40. The connecting portion 50 formed on the first surface 40 and the second surface 42 passes through the insulating substrate 38, thereby forming a through-hole via for electrical connection. The signal lead 26 is joined to the connecting portion 50. The signal lead 26 is inserted into the through-hole via, and is joined to the connecting portion 50 with solder 52. The solder 52 applied on the connecting portion 50 formed on the second surface 42 may flow through the through-hole via to reach the connecting portion 50 formed on the first surface 40.

The wiring substrate 36 includes a protective film 54 for covering the wiring pattern 44. The protective film 54 formed on the first surface 40 overlaps the stem 14. Part of the protective film 54 is opened so that the connecting portion 50 (through-hole via) of the wiring pattern 44 may be exposed.

The optical module includes a flexible insulating layer 56. The flexible insulating layer 56 is formed between the optical subassembly 10 (stem 14) and the wiring substrate 36. The flexible insulating layer 56 is in contact with the connecting portion 50, the signal lead 26, and the surface of the stem 14. The signal lead 26 passes through the flexible insulating layer 56 to be in contact with the flexible insulating layer 56. The flexible insulating layer 56 is formed of a soft dielectric material, and hence the signal lead 26 can easily pierce the flexible insulating layer 56.

The flexible insulating layer 56 preferably has adhesiveness and a high dielectric constant (for example, a dielectric constant of 3.3). The flexible insulating layer 56 having an adhesiveness can prevent separation of the wiring substrate 36, thereby improving soldering workability. The wiring substrate 36 is pressed against the stem 14 so that the flexible insulating layer 56 may absorb roughness of the stem 14 and the wiring substrate 36. With this, the vicinity of the signal lead 26 can be filled with the dielectric material.

According to this embodiment, the space between the connecting portion 50 and the signal lead 26, the space between the connecting portion 50 and the surface of the stem 14, and the space between the signal lead 26 and the surface of the stem 14 are filled with the flexible insulating layer 56 having a dielectric constant higher than that of air. Thus, electrical connection with the stem 14 and the plane layer 46 of the wiring substrate 36 can be prompted compared to the related art in which an air layer or a vacuumed layer is formed between the components, and hence parasitic inductance of the signal lead 26 can be reduced. Further, due to the formation of the flexible insulating layer 56, there may be no need for a spacer between the wiring substrate 36 and the stem 14, and hence a distance between the wiring substrate 36 and the stem 14 can be shortened. An impedance mismatch region can therefore be reduced.

Second Embodiment

Figure 4:
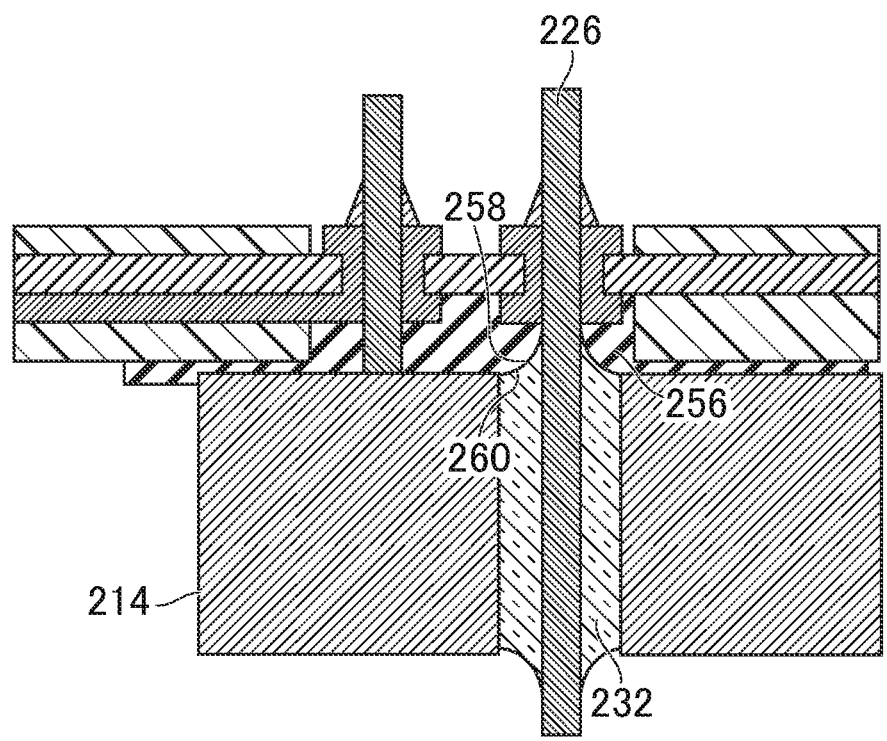
FIG. 4 is a sectional view for illustrating the details of an optical module according to a second embodiment of the present invention.

FIG. 4 is a sectional view for illustrating the details of an optical module according to a second embodiment of the present invention. In this embodiment, an insulating material 232 is filled so that a projecting portion 258 maybe formed that protrudes from a surface of a stem 214. The projecting portion 258 is formed by the insulating material 232 creeping along a signal lead 226 by the surface tension, due to variations between lots. In such a case, a flexible insulating layer 256 has a recessed portion 260 in contact with the projecting portion 258. That is, the flexible insulating layer 256 absorbs the projecting portion 258 of the insulating material 232, and hence a wiring substrate 236 is mounted on the stem 214 without forming any air gap therebetween. It is therefore not necessary to consider how much the insulating material 232 creeps up, when designing the stem 214, thereby providing an effect of reducing the price of the stem 214. The description made in the first embodiment is applied to the second embodiment about the remaining structures.

Third Embodiment

Figure 5:
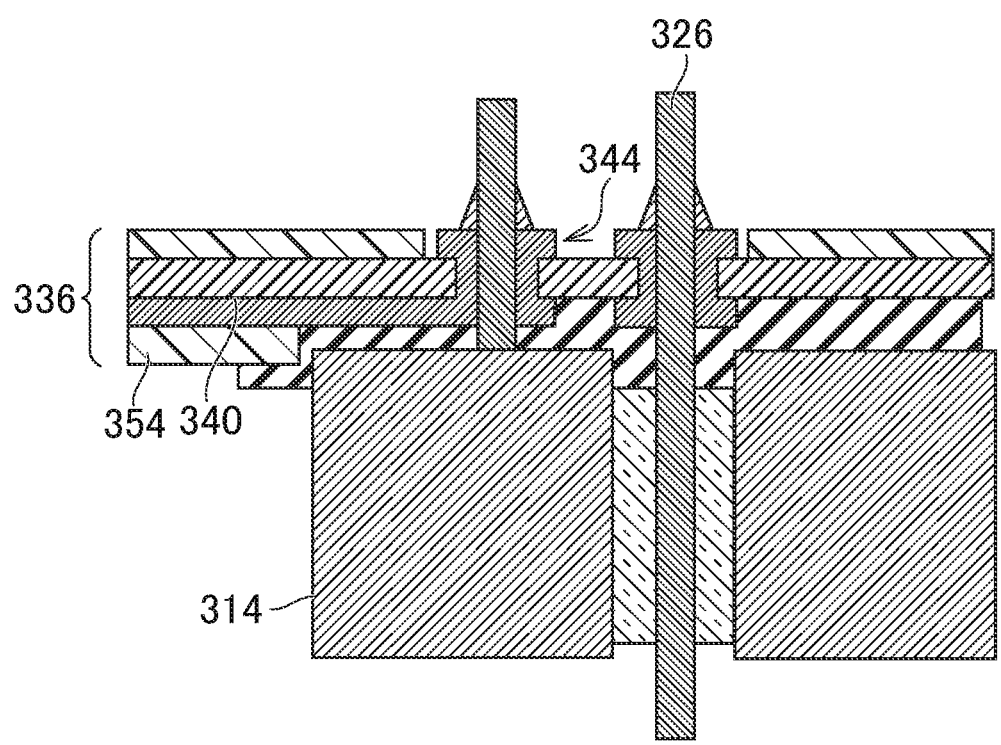
FIG. 5 is a sectional view for illustrating the details of an optical module according to a third embodiment of the present invention.

FIG. 5 is a sectional view for illustrating the details of an optical module according to a third embodiment of the present invention. In this embodiment, a protective film 354 formed on a first surface 340 overlaps a region other than a stem 314. The protective film 354 is not formed between the stem 314 and a wiring substrate 336, and hence a wiring pattern 344 and a signal lead 326 can be joined to each other at a position close to the stem 314. Impedance mismatch can therefore be reduced compared to the first embodiment, and hence excellent high-frequency characteristics can be expected. The description made in the first embodiment is applied to the third embodiment about the remaining structures.

Fourth Embodiment

Figure 6:
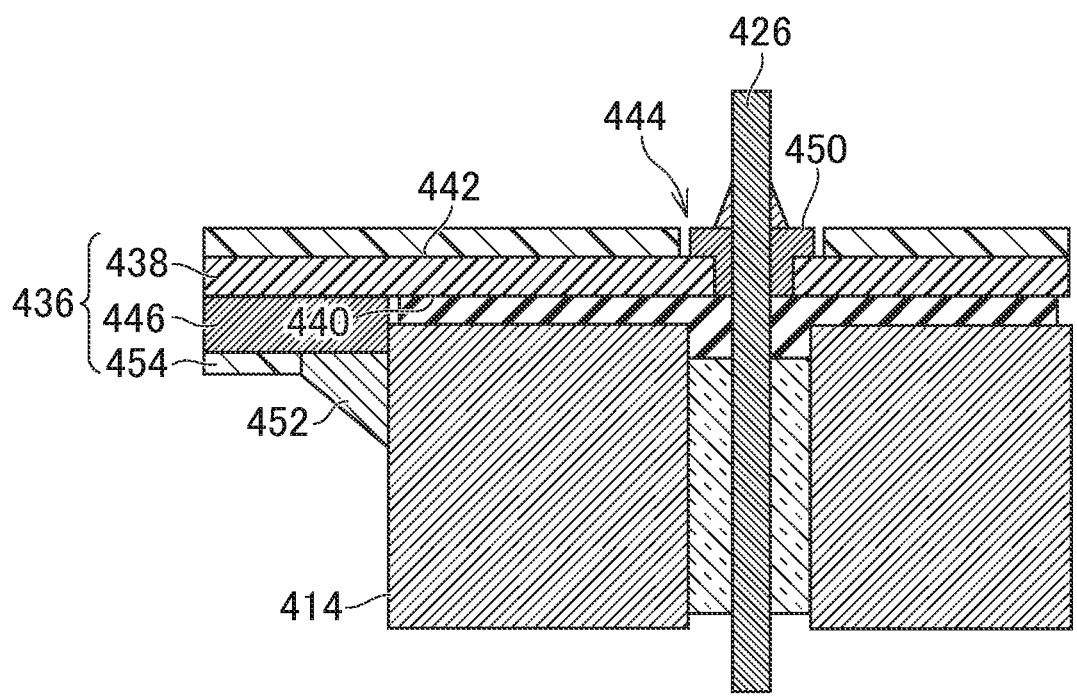
FIG. 6 is a sectional view for illustrating the details of an optical module according to a fourth embodiment of the present invention.

FIG. 6 is a sectional view for illustrating the details of an optical module according to a fourth embodiment of the present invention. In this embodiment, a wiring pattern 444 formed on a first surface 440 overlaps a region other than a stem 414. Further, a protective film 454 formed on the first surface 440 overlaps a region other than the stem 414.

The wiring pattern 444 includes signal wiring (not shown) formed not on the first surface 440 but on a second surface 442, and a connecting portion 450 electrically connected to the signal wiring is formed not on the first surface 440 but on the second surface 442. A signal lead 426 is joined to the connecting portion 450 on the second surface 442 side.

The wiring pattern 444 is electrically connected to the stem 414 on the first surface 440 side. The stem 414 is electrically connected to a plane layer 446 of the wiring pattern 444 on a side surface of the stem 414 while avoiding a surface that is opposed to a wiring substrate 436. This electrical connection is made with solder 452.

According to this embodiment, neither the signal wiring (not shown) nor the connecting portion 450 is formed on the first surface 440, and hence the stem 414 can be arranged closer to an insulating substrate 438 of the wiring substrate 436, thereby shortening a length of a portion where impedance mismatches tend to occur.

Although not illustrated, on the second surface 442, reference wiring is preferably formed in parallel to the signal wiring (not shown) so as to be connected to a reference potential, thereby forming a grounded coplanar line in order to match impedances. The description made in the first embodiment is applied to the fourth embodiment about the remaining structures.

Fifth Embodiment

Figure 7:
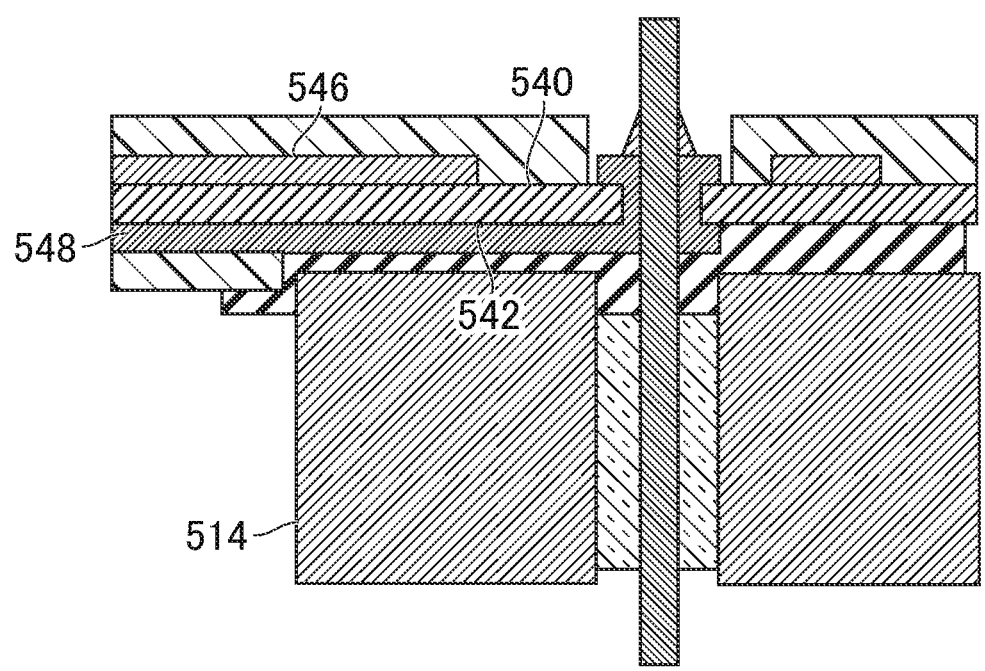
FIG. 7 is a sectional view for illustrating the details of an optical module according to a fifth embodiment of the present invention.

FIG. 7 is a sectional view for illustrating the details of an optical module according to a fifth embodiment of the present invention. In this embodiment, signal wiring 548 is formed on a second surface 542 (a side opposed to a stem 514), and a plane layer 546 is formed on a first surface 540 (an opposite side from the stem 514). By forming the signal wiring 548 on the second surface 542, a portion where impedance mismatches tend to occur is made shorter than in the example illustrated in FIG. 6. The signal wiring 548 is surrounded by the plane layer 546 and the stem 514 to form a stripline. The description made in the first embodiment is applied to the fifth embodiment about the remaining structures.

EXAMPLE

Hitherto, a spacer is formed between a flexible printed board and a stem in order to prevent short-circuiting between solder and the stem. The spacer has an opening through which a signal lead for transmitting high-frequency electrical signals passes, and the opening has a diameter larger than that of the signal lead. Thus, an air layer (hereinafter referred to as "air gap") of about 0.1 mm is formed around a region of the signal lead that passes through the spacer. In addition, an insulating material, e.g., glass for electrical insulation between the stem and the signal lead may not reach a surface of the stem due to variations in application (for example, the state of FIG. 3), with the result that an air gap is formed. The spacer is formed of a material having a certain hardness, and hence the spacer is not deformed to fill this air gap. The inventors of the present invention have conducted an investigation and found that the above-mentioned air gap region turned into a minute inductive region that had no negative influence on transmission of 10 Gbit/s electrical signals, but had a negative influence on transmission of high-frequency electrical signals in the 25 Gbit/s class.

Then, the related-art optical module and the optical module illustrated in FIG. 5 were compared to each other by a high frequency 3D electromagnetic field simulator (High Frequency Structure Simulator; HFSS), in terms of their reflection characteristics and transmission characteristics.

Figure 8:
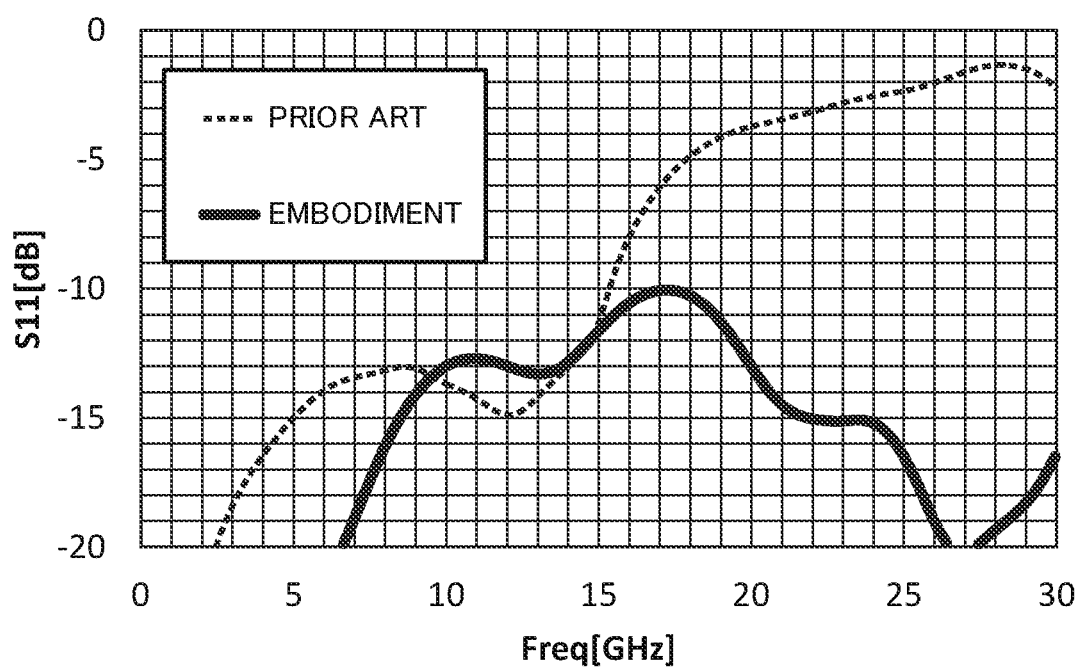
FIG. 8 is a graph for showing a result of comparison between reflection characteristics of the related art and the third embodiment by a high frequency 3D electromagnetic field simulator (High Frequency Structure Simulator; HFSS).
Figure 9:
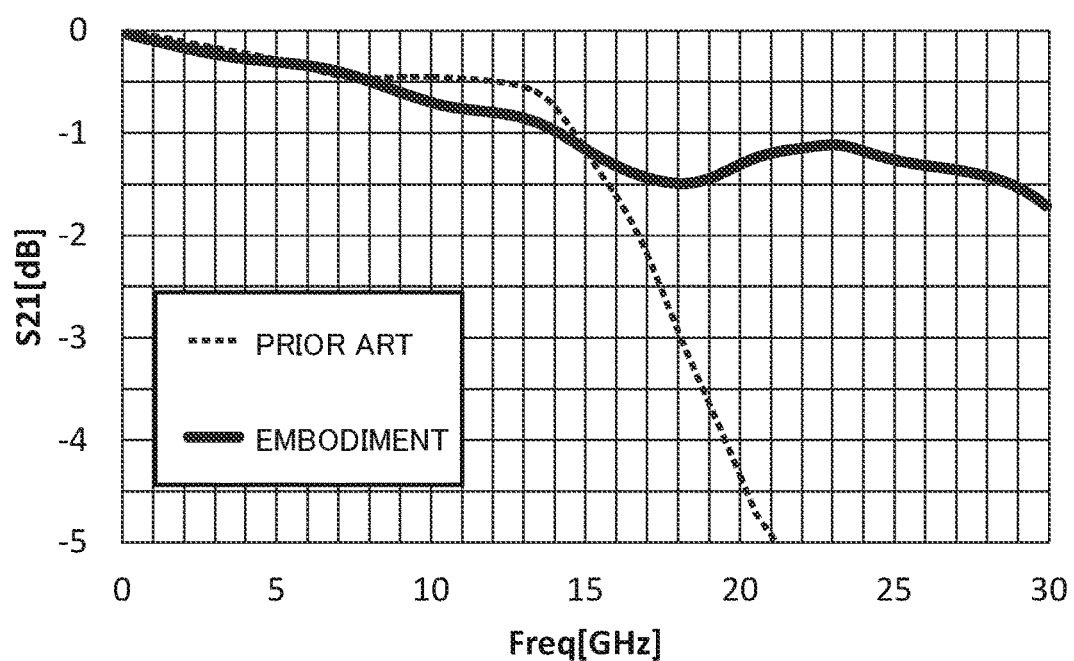
FIG. 9 is a graph for showing a result of comparison between transmission characteristics of the related art and the third embodiment by the high frequency 3D electromagnetic field simulator (High Frequency Structure Simulator; HFSS).

FIG. 8 is a graph for showing a result of the comparison between the reflection characteristics of the related art and the third embodiment by the high frequency 3D electromagnetic field simulator (High Frequency Structure Simulator; HFSS). FIG. 9 is a graph for showing a result of the comparison between the transmission characteristics of the related art and the third embodiment by the high frequency 3D electromagnetic field simulator (High Frequency Structure Simulator; HFSS).

In the optical module according to the related art, a reflection characteristic S11 and a transmission characteristic S21 are rapidly deteriorated at 20 GHz or more. On the other hand, in the optical module according to the third embodiment, a reflection characteristic and a transmission characteristic near 25 GHz are significantly improved.

In the optical module according to the third embodiment, the flexible insulating layer 56 is formed between the wiring substrate 36 and the stem 14 instead of a spacer, and hence no air gap is formed around a region of the signal lead 26 that passes through the spacer in the related art, that is, the flexible insulating layer 56 is formed in contact with the signal lead 26. Further, the flexible insulating layer 56 is deformed when the wiring substrate 36 is mounted on the stem 14 while applying stress . Thus, the flexible insulating layer 56 also enters an air gap region formed between the wiring substrate 36 and the stem 14 due to variations in application of the insulating material 32 into the through hole 30 of the stem 14, which cannot be filled with the spacer in the related art, and hence the flexible insulating layer 56 can be formed around the signal lead 26 in this region. With this effect, it is possible to provide an optical module having a reduced inductance and excellent high-frequency characteristics compared to the one having an air gap formed therein according to the related art. In addition, the flexible insulating layer 56 can be thinner than the spacer, and hence an effect of further reducing an inductance compared to the case using the spacer is obtained. Further, as described above, the air gap formed due to variations in application of the insulating material 32 into the through hole 30 of the stem 14 can also be filled, and hence an inexpensive stem can be used, thereby being capable of providing an inexpensive optical module.

It is desired that the air gap formed around the signal lead 26 be ideally completely filled with the flexible insulating layer 56. The signal lead 26 may not be completely surrounded in some cases due to variations in manufacturing. Even in such a case, however, the flexible insulating layer 56 increases effective dielectric constant around the signal lead 26, and hence an inductance reduction effect is obtained compared to the case in which a large air gap is formed as in the related art. Thus, the flexible insulating layer 56 does not necessarily completely surround the signal lead 26.

While there have been described what are at present considered to be certain embodiments of the invention, it will be understood that various modifications may be made thereto, and it is intended that the appended claims coverall such modifications as fall within the true spirit and scope of the invention. For example, in the embodiments described above, the flexible insulating layer 56 is exemplified as a soft layer that the signal lead 26 can pierce, but the flexible insulating layer 56 is not limited thereto. More specifically, the flexible insulating layer 56 maybe a layer that has flexibility in a manufacturing step of connecting the stem 14 and the wiring substrate 36 to each other, and is cured to lose its flexibility thereafter through application of a certain energy. As an example, a UV curing agent is given. A UV curing agent is a material that is a liquid having viscosity in an initial state, and is solidified through irradiation of UV rays. With the use of, for example, a UV curing agent, an effect equivalent to that of the invention of the subject application is obtained. A flexible insulating layer used herein represents an insulating layer having flexibility in a manufacturing step of connecting a stem and a wiring substrate to each other.

What is claimed is:

1. An optical module, comprising:
   an optical subassembly configured to convert at least one of an optical signal or an electrical signal into another one of the optical signal and the electrical signal;
   a wiring substrate that has a wiring pattern comprising a connecting portion and is arranged on the optical subassembly so as to be electrically connected thereto; and
   a flexible insulating layer formed between the optical subassembly and the wiring substrate,
   the optical subassembly comprising:
      a conductive stem that has a surface opposed to the wiring substrate, the conductive stem being shaped so that the surface has a through hole opened therein and being connected to a reference potential; and
      a signal lead for transmitting a signal, the signal lead passing through the through hole while being electrically insulated from the conductive stem,
   the signal lead passing through the flexible insulating layer to be joined to the connecting portion,
   the flexible insulating layer being in contact with the connecting portion, the signal lead, and the surface of the conductive stem.

2. The optical module according to claim 1,
   wherein the wiring substrate comprises an insulating substrate having a thickness corresponding to a distance between a first surface and a second surface of the insulating substrate,
   wherein the first surface is opposed to the surface of the conductive stem, and
   wherein at least part of the connecting portion is formed on the first surface.

3. The optical module according to claim 2,
   wherein the connecting portion is formed on the first surface and the second surface so as to pass through the insulating substrate, to thereby form a through-hole via for electrical connection, and
   wherein the signal lead is inserted into the through-hole via.

4. The optical module according to claim 2, wherein the wiring pattern comprises signal wiring connected to the connecting portion, for transmitting the signal, and a plane layer for connection with the reference potential.

5. The optical module according to claim 4,
   wherein the signal wiring is formed on the second surface, and
   wherein the plane layer is formed on the first surface.

6. The optical module according to claim 4,
   wherein the signal wiring is formed on the first surface, and
   wherein the plane layer is formed on the second surface.

7. The optical module according to claim 2,
   wherein the wiring substrate comprises a protective film for covering the wiring pattern, and
   wherein the wiring pattern is formed on the first surface and the second surface.

8. The optical module according to claim 7, wherein the wiring pattern formed on the first surface overlaps the conductive stem.

9. The optical module according to claim 7, wherein the wiring pattern formed on the first surface overlaps a region other than the conductive stem.

10. The optical module according to claim 7, wherein the protective film formed on the first surface overlaps the conductive stem.

11. The optical module according to claim 7, wherein the protective film formed on the first surface overlaps a region other than the conductive stem.

12. The optical module according to claim 1, wherein the optical subassembly further comprises a reference lead electrically connected to the conductive stem in order to electrically connect the conductive stem to the reference potential.

13. The optical module according to claim 1,
   wherein the wiring pattern is electrically connected to the conductive stem on the first surface, and
   wherein the conductive stem is electrically connected to the wiring pattern on a side surface of the conductive stem while avoiding the surface.

14. The optical module according to claim 1,
   wherein the through hole of the conductive stem and the signal lead are electrically insulated from each other with an insulating material,
   wherein the insulating material is filled so that a projecting portion is formed that protrudes from the surface of the conductive stem, and
   wherein the flexible insulating layer has a recessed portion in contact with the projecting portion.

* * * * *